United States Patent
Yamaguchi et al.

(10) Patent No.: US 11,621,171 B2
(45) Date of Patent: Apr. 4, 2023

(54) METHOD FOR POLISHING SILICON WAFER WITH REDUCED WEAR ON CARRIER, AND POLISHING LIQUID USED THEREIN

(71) Applicant: Nissan Chemical Corporation, Tokyo (JP)

(72) Inventors: Hayato Yamaguchi, Funabashi (JP); Yusuke Tanatsugu, Funabashi (JP); Eiichiro Ishimizu, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 17/279,482

(22) PCT Filed: Sep. 20, 2019

(86) PCT No.: PCT/JP2019/036908
§ 371 (c)(1),
(2) Date: Mar. 24, 2021

(87) PCT Pub. No.: WO2020/066873
PCT Pub. Date: Apr. 2, 2020

(65) Prior Publication Data
US 2021/0407816 A1    Dec. 30, 2021

(30) Foreign Application Priority Data
Sep. 25, 2018 (JP) .............................. JP2018-179508

(51) Int. Cl.
*H01L 21/306* (2006.01)
*C09G 1/02* (2006.01)

(52) U.S. Cl.
CPC .......... *H01L 21/30625* (2013.01); *C09G 1/02* (2013.01)

(58) Field of Classification Search
None
See application file for complete search history.

(56) References Cited

U.S. PATENT DOCUMENTS

| | | | |
|---|---|---|---|
| 2008/0311750 A1* | 12/2008 | Izumi | B24B 37/044 438/693 |
| 2009/0104852 A1 | 4/2009 | Pietsch et al. | |
| 2010/0163786 A1 | 7/2010 | Izumi et al. | |
| 2012/0315739 A1* | 12/2012 | Hashii | B24B 37/08 438/460 |
| 2018/0258320 A1* | 9/2018 | Yoshizaki | C09K 3/1463 |

FOREIGN PATENT DOCUMENTS

| | | |
|---|---|---|
| JP | 2008-270584 A | 11/2008 |
| JP | 2009-99980 A | 5/2009 |
| JP | 2010-153613 A | 7/2010 |
| JP | 2016-204187 A | 12/2016 |
| JP | 2018-129397 A | 8/2018 |
| WO | WO 2017/047307 A1 | 3/2017 |
| WO | WO 2017/057478 A1 | 4/2017 |

OTHER PUBLICATIONS

International Search Report for PCT/JP2019/036908 dated Oct. 21, 2019.
Written Opinion of the International Searching Authority for PCT/JP2019/036908 dated Oct. 21, 2019.

* cited by examiner

*Primary Examiner* — Stephanie P Duclair
(74) *Attorney, Agent, or Firm* — Birch, Stewart, Kolasch & Birch, LLP

(57) ABSTRACT

Provided is a method that is for polishing a silicon wafer by a polishing device using a carrier holding the silicon wafer, and that can reduce wear on the carrier. In this polishing method, a polishing liquid used in the polishing device contains 0.1-5 mass %, in terms of the concentration of silica, silica particles comprising: silica particles (A) having an average primary particle size of 4-30 nm as measured by BET, and having an ($X_2/X_1$) ratio of 1.2-1.8, where $X_2$ (nm) represents an average particle size along the major axis thereof as calculated from a perspective projection image obtained using an electron beam, and $X_1$ (nm) represents the average primary particle size as measured by BET; and silica particles (B) having an average primary particle size of more than 30 nm but not more than 50 nm as measured by BET, and having a ($X_2/X_1$) ratio of 1.2-1.8, where $X_2$ (nm) represents an average particle size along the major axis thereof as calculated from a perspective projection image obtained using an electron beam, and $X_1$ (nm) represents the average primary particle size as measured by BET, wherein the mass ratio of the silica particles (A) to the silica particles (B) is 100:0 to 85:15.

13 Claims, No Drawings

METHOD FOR POLISHING SILICON WAFER WITH REDUCED WEAR ON CARRIER, AND POLISHING LIQUID USED THEREIN

TECHNICAL FIELD

The present invention relates to a method for polishing a silicon wafer with a polishing machine using a carrier holding the silicon wafer. In particular, the present invention relates to a method for polishing a silicon wafer with a double-sided polishing carrier used in a double-sided polishing machine for polishing a silicon wafer.

BACKGROUND ART

The polishing of a silicon wafer is used in each process including a wrapping process and a polishing process.

Examples of a polishing machine include a single-sided polishing machine and a double-sided polishing machine, and when polishing the silicon wafer using a carrier, the double-sided polishing machine is mainly used. The double-sided polishing machine can process many silicon wafers at the same time by a processing method referred to as a batch treatment.

The double-sided polishing machine has a structure, wherein a lower surface plate and an upper surface plate, and a plurality of carriers in between them drive to rotate and its rotation is performed planetarily along a gear. The carrier has a disk-shaped structure that has a gear on the outer edge and can insert a silicon wafer, and in some cases, a plurality of silicon wafers can be inserted into one carrier. In the double-sided polishing machine, these carriers receive the supply of a polishing liquid between a lower grindstone and an upper grindstone, and both sides of a silicon wafer are polished while planetarily rotating.

The carrier exists while being pressurized between the lower surface plate and the upper surface plate, which a polishing pad is attached to, and is constantly exposed to a polishing state with the polishing liquid, so that the carrier itself is worn together with a silicon wafer.

The carrier is replaced with a new carrier when polishing wear is severe, but the carrier itself is constantly exposed to polishing during the polishing process, and the carrier itself is polished, so that deterioration of polishing accuracy (specifically, evenness, flatness, roughness, parallelism/thickness variation, etc.) due to a deformation of the carrier itself, variation in polishing rate (i.e., polishing amount per unit time) and polishing quality, and noise (i.e., abnormal noise) generated from the carrier have become problems.

Patent Literature 1 discloses a carrier in which the surface of a carrier is coated with a hard material selected from the group consisting of polyvinylidene fluoride, polyamide, polypropylene, polyethylene, polyethylene terephthalate, polycarbonate, polystyrene, and a polymer alloy thereof as a carrier used in a lapping device, a polishing machine, and a grinding device to maintain low wear on the carrier.

Patent Literature 2 discloses a method for polishing a silicon wafer in a method of producing an epitaxial wafer in which an epitaxial layer is grown using a vapor phase growth device after the polishing is performed with a double-sided polishing machine including a carrier.

CITATION LIST

Patent Literature

PATENT LITERATURE 1: JP 2009-099980 A
PATENT LITERATURE 2: JP 2016-204187 A

SUMMARY OF INVENTION

Technical Problems

An object of the present invention is to provide a novel polishing method to make wear on a carrier reduced in a method for polishing a silicon wafer with a polishing machine using the carrier to hold the silicon wafer. Also, it is another object of the present invention to provide a polishing liquid used in the method.

Solution to Problems

Specifically, various aspects of the present invention are as follows.

[Aspect 1] A method for polishing a silicon wafer with a polishing machine using a carrier to hold the silicon wafer, wherein a polishing liquid used in the polishing machine comprises silica particles at a silica concentration of 0.1% by mass to 5% by mass,
the silica particles consisting of:
silica particles (A) having an average primary particle size of 4 nm to 30 nm as measured by BET method, and having a ratio (X2/X1) of 1.2 to 1.8 when representing a major-axis average particle size calculated from projection images by transmission electron microscope as (X2) nm and an average primary particle size as measured by the BET method as (X1) nm; and
silica particles (B) having an average primary particle size of more than 30 nm and 50 nm or less as measured by the BET method, and having a ratio (X2/X1) of 1.2 to 1.8 when representing a major-axis average particle size calculated from projection images by transmission electron microscope as (X2) nm and an average primary particle size as measured by the BET method as (X1) nm,
wherein a mass ratio of the silica particles (A) to the silica particles (B) is 100:0 to 85:15.

[Aspect 2] A method for polishing a silicon wafer with a polishing machine using a carrier to hold the silicon wafer, wherein a polishing liquid used in the polishing machine comprises:
silica particles at a silica concentration of 0.1% by mass to 5% by mass, the silica particles consisting of: silica particles (A) having an average primary particle size of 4 nm to 30 nm as measured by BET method; and silica particles (B) having an average primary particle size of more than 30 nm and 50 nm or less as measured by the BET method, wherein a mass ratio of the silica particles (A) to the silica particles (B) is 100:0 to 85:15; or
silica particles at a silica concentration of 0.1% by mass or more and less than 2.5% by mass, the silica particles consisting only of silica particles (B') having an average primary particle size of more than 30 nm and less than 45 nm as measured by the BET method.

[Aspect 3] The method according to [Aspect 2], wherein the silica particles (A), the silica particles (B), and the silica particles (B') have, when representing a major-axis average particle size calculated from projection images by transmission electron microscope as (X2) nm and an average primary particle size as measured by the BET method as (X1) nm, a ratio (X2/X1) of 1.2 to 1.8.

[Aspect 4] The method according to any one of any one of [Aspect 1] to [Aspect 3] using a double-sided polishing machine as the polishing machine, comprising polishing the silicon wafer under conditions of a load of 30 to 1000 g/cm$^2$, a lower surface plate rotation speed of 5 to 100 rpm, an upper surface plate rotation speed of 2 to 30 rpm, a rotation ratio of a lower surface plate/an upper surface plate of 1 to 10, a polishing time of 10 minutes to 3 hours, and a polishing liquid supply amount of 1 to 20 liters/minute.

[Aspect 5] The method according to any one of [Aspect 1] to [Aspect 4], wherein the carrier is an epoxy glass carrier.

[Aspect 6] The method according to any one of [Aspect 1] to [Aspect 5], wherein the polishing liquid further comprises at least one additive agent selected from the group consisting of an alkaline component, a water-soluble compound, and a chelating agent.

[Aspect 7] The method according to [Aspect 6], wherein the alkaline component is sodium hydroxide, potassium hydroxide, ammonia, primary ammonium hydroxide, secondary ammonium hydroxide, tertiary ammonium hydroxide, quaternary ammonium hydroxide, lithium carbonate, sodium carbonate, potassium carbonate, lithium hydrogen carbonate, sodium hydrogen carbonate, potassium hydrogen carbonate, sodium hydroxide, or potassium hydroxide.

[Aspect 8] The method according to [Aspect 6], wherein the chelating agent is an aminocarboxylic acid-based chelating agent or a phosphonic acid-based chelating agent.

[Aspect 9] The method according to any one of claims [Aspect 1] to [Aspect 8], wherein a pH value of the polishing liquid is 7 to 12.

[Aspect 10] A polishing liquid for a polishing machine using a carrier to hold a silicon wafer, the polishing liquid comprising silica particles at a silica concentration of 0.1% by mass to 5% by mass,
  the silica particles consisting of:
    silica particles (A) having an average primary particle size of 4 nm to 30 nm as measured by BET method, and having a ratio (X2/X1) of 1.2 to 1.8 when representing a major-axis average particle size calculated from projection images by transmission electron microscope as (X2) nm and an average primary particle size as measured by the BET method as (X1) nm; and
    silica particles (B) having an average primary particle size of more than 30 nm and 50 nm or less as measured by the BET method, and having a ratio (X2/X1) of 1.2 to 1.8 when representing a major-axis average particle size calculated from projection images by transmission electron microscope as (X2) nm and an average primary particle size as measured by the BET method as (X1) nm,
      wherein a mass ratio of the silica particles (A) to the silica particles (B) is 100:0 to 85:15.

[Aspect 11] A polishing liquid for a polishing machine using a carrier to hold a silicon wafer, the polishing liquid comprising:
silica particles at a silica concentration of 0.1% by mass to 5% by mass, the silica particles consisting of: silica particles (A) having an average primary particle size of 4 nm to 30 nm as measured by BET method, and silica particles (B) having an average primary particle size of more than 30 nm and 50 nm or less as measured by the BET method, wherein a mass ratio of the silica particles (A) to the silica particles (B) is 100:0 to 85:15; or silica particles at a silica concentration of 0.1% by mass or more and less than 2.5% by mass, the silica particles consisting only of silica particles (B') having an average primary particle size of more than 30 nm and less than 45 nm as measured by the BET method.

[Aspect 12] The polishing liquid according to [Aspect 11], wherein the silica particles (A), the silica particles (B), and (B') have, when representing a major-axis average particle size calculated from projection images by transmission electron microscope as (X2) nm and an average primary particle size as measured by the BET method as (X1) nm, a ratio (X2/X1) of 1.2 to 1.8.

Advantageous Effects of Invention

A double-sided polishing machine has a structure, wherein a lower surface plate and an upper surface plate, and a plurality of carriers in between them drive to rotate, and its rotation is performed planetarily along a gear. The carrier has a disk-shaped structure that has a gear on the outer edge and can insert a silicon wafer, and in some cases, a plurality of silicon wafers can be inserted into one carrier. In the double-sided polishing machine, their carriers receive the supply of a polishing liquid between a lower grindstone and an upper grindstone, and both sides of a silicon wafer are polished while planetarily rotating.

The carrier exists while being pressurized between the lower surface plate and the upper surface plate, which a polishing pad is attached to, and is constantly exposed to a polishing state with the polishing liquid, so that the carrier itself is worn together with a silicon wafer.

The carrier is replaced with a new carrier when the polishing wear is severe, but the carrier itself is constantly exposed to polishing during the polishing process, and the carrier itself is polished, so that deterioration of polishing accuracy (specifically, evenness, flatness, roughness, parallelism/thickness variation, etc.) due to a deformation of the carrier itself, variation in polishing rate and polishing quality, and noise generated from the carrier have become problems.

According to the method for polishing a silicon wafer according to the present invention and the polishing liquid according to the present invention, when polishing the silicon wafer with a polishing machine using a carrier to hold the silicon wafer, the amount of wear on the carrier exposed to the polishing together with the silicon wafer can be reduced while maintaining a good polishing rate for polishing the silicon wafer. When a silicon wafer is polished with a polishing machine using a carrier to hold the silicon wafer, wear on the carrier causes a deformation of the carrier itself. As a result, the polishing accuracy (specifically, evenness, flatness, roughness, parallelism/thickness variation, etc.) is reduced. However, according to the method for polishing a silicon wafer according to the present invention and the polishing liquid according to the present invention, as described above, wear on the carrier exposed to the polishing together with the polishing of the silicon wafer can be reduced while maintaining a good polishing rate for polishing the silicon wafer. Thus, the decrease of the above polishing accuracy due to a deformation of the carrier itself can be suppressed. Namely, according to the method for polishing a silicon wafer according to the present invention and the polishing liquid according to the present invention, the improvement of the polishing accuracy of a silicon wafer can be made possible.

Furthermore, according to the method for polishing a silicon wafer according to the present invention and the polishing liquid according to the present invention, when polishing a silicon wafer with a polishing machine using a carrier to hold the silicon wafer, the amount of wear of the carrier can be reduced. Thus, the reduction of a frequency of carrier replacement, the suppression of variation in polishing rate and polishing quality, and reduction of noise (abnormal noise) generated from the carrier worn by polishing can be provided.

Therefore, according to the method for polishing a silicon wafer according to the present invention and the polishing liquid according to the present invention, when polishing a silicon wafer with a polishing machine using a carrier to hold the silicon wafer, polishing accuracy of a silicon wafer can be simply and efficiently improved, and productivity can be further improved, compared with the cases of using, when polishing a silicon wafer with the same polishing machine, the conventional polishing method and the conventional polishing liquid.

In the present invention, as one aspect thereof, for example, by using a polishing liquid that includes silica particles at a silica concentration of 0.1% by mass to 5% by mass, which have an average primary particle size in the range of 4 nm to 30 nm as measured by BET method in the polishing liquid, wear on a carrier can be reduced, and the improvement of the polishing accuracy when polishing a silicon wafer can be made possible.

DESCRIPTION OF EMBODIMENTS

Examples of the "polishing machine using a carrier to hold a silicon wafer" used in the present invention include a single-sided polishing machine and a double-sided polishing machine. Among them, the double-sided polishing machine is preferable in that many silicon wafers can be processed at the same time by a processing method referred to as a batch treatment. However, the polishing machine using a carrier to hold a silicon wafer is not particularly limited as long as the objects of the present invention can be achieved.

It is preferable that the "polishing liquid" used in the present invention includes silica particles consisting of: silica particles having an average primary particle size of 4 nm to 30 nm (i.e., 4 nm or more and 30 nm or less) as measured by the BET method (in the present application, these particles are referred to as "silica particles (A)"); and silica particles having an average primary particle size of more than 30 nm and 50 nm or less as measured by the BET method (in the present application, these particles are referred to as "silica particles (B)"), wherein a mass ratio of the silica particles (A) to the silica particles (B) is in the range of 100:0 to 85:15 in a notation of the silica particles (A): the silica particles (B) (i.e., 100:0 or more and 85:15 or less). Here, "the silica particles (A): the silica particles (B) is 100:0" means that the silica particles (i.e., the silica particles consisting of the silica particles (A) and the silica particles (B)) consist only of the silica particles (A) having an average primary particle size in the range of 4 nm to 30 nm as measured by the BET method.

Furthermore, the concentration of the silica in the above "polishing liquid" (i.e., the silica particles consisting of the silica particles (A) and the silica particles (B), and having a mass ratio of the silica particles (A) to the silica particles (B) of 100:0 to 85:15 in a notation of the silica particles (A): the silica particles (B)) is preferably 0.1% by mass to 5% by mass (i.e., 0.1% by mass or more and 5% by mass or less).

The upper limit is more preferably 3.5% by mass, even more preferably 2.5% by mass, and further preferably 2.0% by mass.

The above silica particles (specifically, the silica particles (A) and the silica particles (B)) are silica particles derived from an aqueous silica sol, and an alkaline component, a water-soluble compound, and a chelating agent may be optionally added to the silica sol, thereby producing a polishing liquid.

Although these silica particles are spherical silica particles, the shapes thereof are not a perfect sphere, and by using these silica particles, the improvement of the polishing rate of a silicon wafer and the reduction of wear on a carrier can be provided.

The average primary particle size of the silica particles (specifically, each average particle size of the silica particles (A) and the silica particles (B)) can be expressed as a sphere-equivalent particle size calculated from the surface area obtained by a nitrogen gas adsorption method (i.e., BET method).

As described above, in the present invention, it is preferable that the polishing liquid includes silica particles consisting of the silica particles (A) having an average primary particle size of 4 nm to 30 nm as measured by the BET method and the silica particles (B) having an average primary particle size of more than 30 nm and 50 nm or less as measured by the BET method, wherein a mass ratio of the silica particles (A) to the silica particles (B) is 100:0 to 85:15. In the present invention, the silica particles (A) can be included as the main component, and the silica particles (B) can be included in the above ratio.

Also, in the present invention, it is preferable that both the silica particles (A) and the silica particles (B), used in the above "polishing liquid" have a ratio (X2/X1) in the range of 1.2 to 1.8 (i.e., 1.2 or more and 1.8 or less) when representing a major-axis average particle size calculated from projection images by transmission electron microscope (i.e., transmission electron microscope) as (X2) nm and a sphere-equivalent particle size calculated from the surface area (or specific surface area) as measured by the BET method as an average primary particle size (X1) nm. Namely, as for the silica particles (A), it is preferable that the ratio (X2/X1) is 1.2 to 1.8 when representing a major-axis average particle size calculated from projection images by transmission electron microscope as (X2) nm and an average primary particle size as measured by the BET method as (X1) nm. As for the silica particles (B), it is also preferable that the ratio (X2/X1) is 1.2 to 1.8 when representing a major-axis average particle size calculated from projection images by transmission electron microscope as (X2) nm and an average primary particle size as measured by the BET method as (X1) nm.

The case where the silica particles (A): the silica particles (B) is 100:0 means that it is preferable that only the silica particles (A) satisfy the ratio (X2/X1) in the above range.

Furthermore, as silica particles used in the present invention, the silica particles in which a ratio of a major-axis average particle size (X2) nm calculated from projection images by transmission electron microscope (i.e., transmission electron microscope) to a sphere-equivalent particle size (X1) nm calculated from the surface area, namely, X2/X1 is in the range of 1.2 to 1.8 can be used.

Specifically, in the present invention, it is preferable that both the silica particles (A) and the silica particles (B), used in the above "polishing liquid" have a ratio (X2/X1) in the range of 1.2 to 1.8 (i.e., 1.2 or more and 1.8 or less) when representing a major-axis average particle size calculated from projection images by transmission electron microscope (i.e., transmission electron microscope) as (X2) nm and a sphere-equivalent particle size calculated from the surface area (or specific surface area) as measured by the BET method as an average primary particle size (X1) nm. Namely, as for the silica particles (A), it is preferable that the ratio (X2/X1) is 1.2 to 1.8 when representing a major-axis average particle size calculated from projection images by transmission electron microscope as (X2) nm and an average primary particle size as measured by the BET method as (X1) nm. As for the silica particles (B), it is also preferable that the ratio (X2/X1) is 1.2 to 1.8 when representing a major-axis average particle size calculated from projection images by transmission electron microscope as (X2) nm and an average primary particle size as measured by the BET method as (X1) nm.

The case where the silica particles (A): the silica particles (B) is 100:0 means that it is preferable that only the silica particles (A) satisfy the ratio (X2/X1) in the above range.

Both X2 and X1 are average particle sizes as described above. For example, X2 can be determined by arbitrarily selecting 100 particles in a transmission electron micrograph, measuring the major axis of each particle, and calculating their average value. X1 is a sphere-equivalent particle size calculated from the surface area, and can be used as a value of an average primary particle size as measured by the BET method.

As described above, the polishing liquid includes silica particles consisting of the silica particles (A) and the silica particles (B) in the range of 100:0 to 85:15 in the notation of the silica particles (A): the silica particles (B), and the silica concentration is preferably 0.1% by mass to 5% by mass (the upper limit thereof is more preferably 2.5% by mass and further preferably 2.0% by mass). However, instead of the polishing liquid, a polishing liquid including silica particles consisting only of silica particles having an average primary particle size of more than 30 nm and less than 45 nm as measured by the BET method at a silica concentration of 0.1% by mass or more and less than 2.5% by mass may be used.

In the present application, when the silica particles included in the polishing liquid consist only of silica particles having an average particle size of more than 30 nm and less than 45 nm as measured by the BET method, for convenience, the silica particles are also referred to as "silica particles (B')" in order to distinguish them from the "silica particles (B)" including the average particle size of more than 30 nm and less than 45 nm.

When the silica particles included in the polishing liquid are silica particles (B') (i.e., the silica particles included in the polishing liquid consist only of the silica particles having an average primary particle size of more than 30 nm and less than 45 nm as measured by the BET method), and the silica concentration is preferably 0.1% by mass or more and less than 2.5% by mass, more preferably 0.1% by mass or more and 1.0% by mass or less, and further preferably 1.0% by mass.

When the silica particles in the polishing liquid consist only of the silica particles (A), the present invention is a method for polishing a silicon wafer by a polishing machine using a carrier to hold the silicon wafer, wherein the polishing liquid used in the polishing machine includes the silica particles (A) having an average primary particle size of 4 nm to 30 nm as measured by the BET method, and in the method, the polishing liquid having a silica concentration of 0.1% by mass to 5% by mass, more preferably 0.1% by mass to 3.5% by mass, even more preferably 0.1% by mass to 2.5% by mass, still more preferably 0.1% by mass to 2.0% by mass is used.

When the silica particles in the polishing liquid consist of the silica particles (A) and the silica particles (B), wherein the silica particles (A): the silica particles (B) are in the range of 100:0 to 85:15, and the silica concentration is 0.1% by mass to 5% by mass, it is preferable that both the silica particles (A) and the silica particles (B) used in the "polishing liquid" have a ratio (X2/X1) in the range of 1.2 to 1.8 when representing a major-axis average particle size calculated from projection images by transmission electron microscope (i.e., transmission electron microscope) as (X2) nm and a sphere-equivalent particle size calculated from the surface area (or specific surface area) as measured by the BET method as an average primary particle size (X1) nm.

When the silica particles in the polishing liquid are silica particles (B'), wherein the silica concentration is 0.1% by mass or more and less than 2.5% by mass, it is preferable that the silica particles (B') has the range of 1.2 to 1.8 as (X2/X1) obtained in the same way as the silica particles (A) and the silica particles (B).

In the present invention, the polishing can be performed using a single-sided polishing machine under a load of 30 to 1000 g/cm$^2$ (i.e., 30 g/cm$^2$ or more and 1000 g/cm$^2$ or less) and under the conditions of a surface plate rotation speed of 10 to 300 rpm (i.e., 10 rpm or more and 300 rpm or less), a polishing time of 1 to 30 hours (i.e., 1 hour or more and 30 hours or less), and a polishing liquid supply amount of 10 to 400 ml/min (i.e., 10 ml/min or more and 400 ml/min or less). Preferably, the polishing is performed using a double-sided polishing machine under a load of 30 to 1000 g/cm$^2$ (i.e., 30 g/cm$^2$ or more and 1000 g/cm$^2$ or less) and under the conditions of lower surface plate rotation speed of 5 to 100 rpm (i.e., 5 rpm or more and 100 rpm or less), an upper surface plate rotation speed of 2 to 30 rpm (i.e., 2 rpm or more and 30 rpm or less), a lower surface plate/upper surface plate rotation ratio of 1 to 10 (i.e., one or more and 10 or less), a polishing time 10 minutes to 3 hours (i.e., 10 minutes or more and 3 hours or less), a polishing liquid supply amount of 1 to 20 liters/minute (i.e., 1 liter/minute or more and 20 liters/minute or less).

Examples of the carrier used in the present invention include a glass epoxy (in the present application, it is also referred to as an "epoxy glass") resin carrier, a vinyl chloride resin carrier, a carbon carrier, and a polycarbonate resin carrier.

The above carrier can have a coating structure, wherein the surface thereof is coated with a hard resin. Examples of the hard resin include a hard material selected from the group consisting of polyvinylidene fluoride, polyamide, polypropylene, polyethylene, polyethylene terephthalate, polycarbonate, polystyrene, and a polymer alloy thereof.

An epoxy glass carrier of which the thickness is arbitrarily set can be used in consideration of the thickness of a wafer. The glass epoxy resin carrier which is often used as a carrier and is less likely to warp and improves plate thickness accuracy can be applied. A laminated board using the glass epoxy resin is a laminated board made of a thermosetting resin produced by stacking two or more layers of sheets in which a glass fiber is impregnated with an epoxy resin, heating and pressurizing them.

The polishing liquid used in the present invention can be produced based on an aqueous silica sol. For example, the aqueous silica sol can be obtained by growing, under heating, particles of an active silicic acid obtained by a cation exchange of water glass. As such a silica sol, for example, SNOWTEX (trade name) manufactured by Nissan Chemical Corporation can be used.

At least one additive agent selected from the group consisting of an "alkaline component", a "water-soluble compound" that can be in the form of a water-soluble resin, and a "chelating agent" that can be in the form of a chelating resin can be added to the silica sol to prepare the polishing liquid.

As the "alkaline component", sodium hydroxide, potassium hydroxide, ammonia, primary ammonium hydroxide, secondary ammonium hydroxide, tertiary ammonium hydroxide, quaternary ammonium hydroxide (for example, ethyltrimethylammonium hydroxide (ETMAH)), lithium carbonate, sodium carbonate, potassium carbonate, lithium hydrogen carbonate, sodium hydrogen carbonate, potassium hydrogen carbonate, sodium hydroxide, or potassium hydroxide can be used.

By adding the alkaline components to the silica sol, a pH value of the polishing liquid can be adjusted in the range of 7 to 12 (i.e., 7 or more and 12 or less).

As the "chelating agent", an aminocarboxylic acid-based chelating agent (for example, ethylenediaminetetraacetate sodium (EDTA)) or a phosphonic acid-based chelating agent can be used.

As the "water-soluble compound", any water-soluble compound can be used. For example, a hydroxyethyl cellulose, glycerin, a polyglycerin, a polyvinyl alcohol, or a carboxyl group- or sulfonic acid group-modified polyvinyl alcohol can be used.

The present invention relates to a method of making wear on a carrier reduced in a method for polishing a silicon wafer with a polishing machine using a carrier to hold the silicon wafer. The amount of wear of a carrier is arbitrarily determined depending on the conditions for use. In the present invention, considering the relation with polishing accuracy, for example, the case where the amount of wear on one side of the carrier is within 3 μm when the polishing is continuously performed for 8 hours can be defined as preferable because the amount of wear is low. The amount of wear is more preferably in the range of 1.9 μm or less, and further preferably in the range of 1.8 μm or less.

Next, the present invention is described in detail with reference to specific examples, but the present invention is not limited to these examples.

EXAMPLES

A commercially available silicon wafer was polished by the following method.

First, various kinds of colloidal silicas were prepared, and various kinds of polishing compositions were prepared using them. Here, the "colloidal silica" means silica particles included in a silica sol. Next, these various polishing compositions were used as a polishing liquid used in a polishing machine for polishing a silicon wafer using a carrier to hold the silicon wafer, and a commercially available silicon wafer was polished using each of them. An effect of the polishing composition that is a specific embodiment of the present invention was evaluated from the polishing rate and the amount of wear on a carrier after the polishing was continuously performed for 8 hours. The details are shown below.

1) Preparation of Polishing Composition (i.e., Polishing Liquid)

First, the following colloidal silicas A to G were prepared.

Colloidal silica A: Colloidal silica with average primary particle size of 23 nm determined by nitrogen gas adsorption method (i.e., BET method) (silica particles based on silica sol, ratio (X2/X1) is 1.4).

Colloidal silica B: Colloidal silica with average primary particle size of 25 nm determined by nitrogen gas adsorption method (i.e., BET method) (silica particles based on silica sol, ratio (X2/X1) is 1.4).

Colloidal silica C: Colloidal silica with average primary particle size of 21 nm determined by nitrogen gas adsorption method (i.e., BET method) (silica particles based on silica sol, ratio (X2/X1) is 1.7).

Colloidal silica D: Colloidal silica with average primary particle size of 45 nm determined by nitrogen gas adsorption method (i.e., BET method) (silica particles based on silica sol. (X2/X1) ratio is 1.2).

Colloidal silica E: Colloidal silica with average primary particle size of 35 nm determined by nitrogen gas adsorption method (i.e., BET method) (silica particles based on silica sol, ratio (X2/X1) is 1.3).

Colloidal silica F: Colloidal silica with average primary particle size of 60 nm determined by a nitrogen gas adsorption method (i.e., BET method) (silica particles based on silica sol, ratio (X2/X1) is 1.2).

Colloidal silica G: Colloidal silica with average primary particle size of 20 nm determined by nitrogen gas adsorption method (i.e., BET method) (silica particles based on silica sol, ratio (X2/X1) is 1.9).

An aqueous silica sol that was commercially available (manufactured by Nissan Chemical Corporation, trade name: SNOWTEX) was used for the preparation of each colloidal silica above. Each silica sol can be produced by particle growth of an active silicic acid obtained by a cation exchange of water glass under heating.

In the "ratio (X2/X1)" that specifies the silica particles of each colloidal silica above, X1 represents an average primary particle size (nm) determined by the nitrogen gas adsorption method (i.e., BET method), and X2 represents a major-axis average particle size (nm) calculated from a transmission projection image obtained using an electron beam.

The X1 is defined as the sphere-equivalent particle size (nm) calculated from the surface area (or specific surface area) measured using the nitrogen gas adsorption method (i.e., BET method) as the average primary particle size (in the present application, the average primary particle size is also referred to as "(X1) nm"). Specifically, as for each of the above colloidal silicas, the specific surface area S (m$^2$/g) of the silica particles is measured using a BET specific surface area analyzer (Monosorb manufactured by Quantachrome Instruments Japan G.K.), and from the specific surface area S (m$^2$/g) measured by the nitrogen adsorption method as a sphere-equivalent size, the sphere-equivalent particle size ((X1) nm) was calculated using the formula: "((X1) nm) =2720/S", and this calculated value was defined as the average primary particle size ((X1) nm) as measured by the BET method.

The X2 value is the major-axis average particle size (nm) calculated from a transmission projection image obtained using an electron beam (in the present application, the average particle size is also referred to as "(X2) nm"). Specifically, the transmission electron microscope which is referred to as "H8000" (trade name) manufactured by Hitachi High-Technologies Corporation was used. And, from the transmission electron micrograph of the silica particles of each colloidal silica above, obtained using this microscope, 100 particles were arbitrarily selected. Then, the major axis of each particle was measured, and the average of them was defined as the major-axis average particle size.

Next, polishing compositions (1) to (8) and comparative polishing compositions (1) to (7) for comparison with them were produced by containing each colloidal silica above, an alkaline component, and a chelating agent at the ratio as shown in the tables below, and thus the remaining component in each composition shown in the tables is water. The produced polishing compositions (1) to (8) and comparative polishing compositions (1) to (7) were used as polishing liquids as described below.

Ethyltrimethylammonium hydroxide (ETMAH) was used as the alkaline component, and sodium ethylenediaminetetraacetate (EDTA) was used as the chelating agent. Reagents were used as these components. ETMAH which was commercially available was used, and EDTA manufactured by CHELEST CORPORATION was used.

To all polishing compositions 1000 ppm of potassium carbonate was added as a pH buffer.

In addition, the "Ratio: % by mass" described together with "Kinds of silica" in the tables indicates the blending ratio of each colloidal silica of the sources of the silica particles in the polishing composition in units of % by mass. For example, the description in the polishing composition (1) means that the colloidal silica used in the production of its composition is only colloidal silica A, and the description in the polishing composition (6) means that the colloidal silica used in the production of its composition consists of the colloidal silica A and the colloidal silica D, and further the mass ratio of the two, namely, the colloidal silica A: the colloidal silica D, is 90:10.

TABLE 1

| Polishing composition No. | pH | Silica concentration | Kinds of silica (Ratio: % by mass) | Additive amount of alkaline component | Additive amount of chelating agent |
|---|---|---|---|---|---|
| (1) | 10.6 | 1.0% by mass | Colloidal silica A (100%) | 500 ppm | 200 ppm |
| (2) | 10.6 | 2.5% by mass | Colloidal silica A (100%) | 500 ppm | 200 ppm |
| (3) | 10.5 | 3.5% by mass | Colloidal silica A (100%) | 500 ppm | 200 ppm |
| (4) | 10.7 | 1.0% by mass | Colloidal silica B (100%) | 500 ppm | 200 ppm |
| (5) | 11.0 | 1.0% by mass | Colloidal silica C (100%) | 500 ppm | 200 ppm |
| (6) | 10.7 | 1.0% by mass | Colloidal silica A (90%) + Colloidal silica D (10%) | 500 ppm | 200 ppm |
| (7) | 10.6 | 2.5% by mass | Colloidal silica A (90%) + Colloidal silica D (10%) | 500 ppm | 200 ppm |
| (8) | 11.0 | 1.0% by mass | Colloidal silica E (100%) | 500 ppm | 200 ppm |

TABLE 2

| Comparative polishing composition No. | pH | Silica concentration | Kinds of silica (Ratio: % by mass) | Additive amount of alkaline component | Additive amount of chelating agent |
|---|---|---|---|---|---|
| (1) | 10.7 | 2.5% by mass | Colloidal silica E (100%) | 500 ppm | 200 ppm |
| (2) | 10.7 | 1.0% by mass | Colloidal silica D (100%) | 500 ppm | 200 ppm |
| (3) | 11.2 | 1.0% by mass | Colloidal silica F (100%) | 500 ppm | 200 ppm |
| (4) | 10.6 | 1.0% by mass | Colloidal silica A (80%) + Colloidal silica D (20%) | 500 ppm | 200 ppm |
| (5) | 10.6 | 2.5% by mass | Colloidal silica A (80%) + Colloidal silica D (20%) | 500 ppm | 200 ppm |
| (6) | 10.6 | 7.0% by mass | Colloidal silica A (100%) | 500 ppm | 200 ppm |
| (7) | 10.7 | 1.0% by mass | Colloidal silica G (100%) | 500 ppm | 200 ppm |

2) Polishing Method and Results

The above polishing compositions (the polishing compositions (1) to (8) and the comparative polishing compositions (1) to (7)) were used as the polishing liquid used in a polishing machine for polishing a silicon wafer using a carrier to hold the silicon wafer, and a silicon wafer which was commercially available was polished. The polishing conditions in this case are shown below.

2-1) Polishing Conditions

Polishing machine: Double-sided polishing machine 13BF manufactured by HAMAI CO., LTD, Load: 150 g/cm$^2$, Upper surface plate rotation speed: 7 rpm, Lower surface plate rotation speed: 20 rpm, Rotation ratio: three, Carrier rotation number: 5.9 rpm, carrier revolution number: 6.6 rpm, and carrier rotation direction: clockwise rotation, Polishing pad: Polishing pad made of a foamed polyurethane (LP-57 (groove width: 2 mm, groove pitch: 20 mm)), Supply amount of polishing liquid: 6.0 L/min, Polishing temperature: 25° C., Number of polished sheets: three wafers per one carrier, Carrier: Epoxy glass carrier (thickness: 0.70 mm), Polishing time for continuously polishing multiple silicon wafers: 8 hours, Silicon wafer: size: 200 mm; conduction type: P type; crystal orientation: <100>; resistivity: less than 100 Ω·cm.

2-2) Polishing Results

A table below shows the polishing results when polishing under the above polishing conditions. The amount of wear on a carrier in the table is the amount of wear on one side of the carrier after the polishing was continuously polished for 8 hours.

TABLE 3

| Polishing composition No. | Amount of wear on carrier (μm/8 hours) | Polishing rate of wafer (μm/min) |
| --- | --- | --- |
| (1) | 0.0 | 0.28 |
| (2) | 0.6 | 0.29 |
| (3) | 1.5 | 0.29 |
| (4) | 1.2 | 0.25 |
| (5) | 0.0 | 0.25 |
| (6) | 0.1 | 0.27 |
| (7) | 1.8 | 0.29 |
| (8) | 1.9 | 0.25 |

TABLE 4

| Comparative polishing composition No. | Amount of wear on carrier (μm/8 hours) | Polishing rate of wafer (μm/min) |
| --- | --- | --- |
| (1) | 10.5 | 0.27 |
| (2) | 5.6 | 0.26 |
| (3) | 4.2 | 0.24 |
| (4) | 5.8 | 0.27 |
| (5) | 6.5 | 0.29 |
| (6) | 5.6 | 0.26 |
| (7) | 5.3 | 0.28 |

For example, comparing the above results between the polishing composition (3) and the comparative polishing composition (7), when polishing a silicon wafer with a polishing machine using a carrier to hold the silicon wafer, in the case of using a polishing liquid including silica particles at a silica concentration in the range of 0.1% by mass to 5% by mass, wherein the silica particles consist of the silica particles (A) having an average primary particle size of 4 nm to 30 nm as measured by the BET method, and having a ratio (X2/X1) in the range of 1.2 to 1.8, it has been confirmed that while maintaining a good polishing rate in the range of 0.25 to 0.29 μm/min, the amount of wear on one side of the carrier can be suppressed to an extremely good value of 1.5 μm/8 hours which is less than 1.8 μm/8 hours after the polishing was continuously performed for 8 hours.

Furthermore, for example, comparing the above results between the polishing compositions (1) to (3) and the comparative polishing composition (6), when polishing a silicon wafer with a polishing machine using a carrier to hold the silicon wafer, in the case of using a polishing liquid including silica particles at a silica concentration in the range of 0.1% by mass to 5% by mass, wherein the silica particles consist only of silica particles (i.e., the silica particles (A)) having an average primary particle size of 4 nm to 30 nm as measured by the BET method, it has been confirmed that while maintaining a good polishing rate of 0.25 to 0.29 μm/min, the amount of wear on one side of the carrier can be suppressed to an extremely good value of not greater than 1.5 μm/8 hours which is less than 1.8 μm/8 hours, after the polishing is continuously performed for 8 hours.

Furthermore, for example, comparing the above results between the polishing compositions (6) and (7) and the comparative polishing compositions (4) and (5), when polishing a silicon wafer with a polishing machine using a carrier to hold the silicon wafer, in the case of using a polishing liquid including silica particles at a silica concentration of 0.1% by mass to 5% by mass, wherein the silica particles consist of: silica particles (i.e., the silica particles (A)) having an average primary particle size of 4 nm to 30 nm as measured by BET method; and silica particles (i.e., silica particles (B)) having an average primary particle size of more than 30 nm and 50 nm or less as measured by the BET method, wherein a mass ratio of the two (i.e., the silica particles (A)/the silica particles (B)) is not less than 85/15, it has been confirmed that while maintaining a good polishing rate in the range of 0.25 to 0.29 μm/min, the amount of wear on one side of the carrier can be suppressed to an extremely good value of not greater than 1.8 μm/8 hours after the polishing was performed for 8 hours.

Furthermore, comparing the above results between the polishing composition (8) and the comparative polishing composition (1), when polishing a silicon wafer with a polishing machine using a carrier to hold the silicon wafer, in the case of using a polishing liquid including silica particles at a silica concentration in the range of 0.1% by mass or more and less than 2.5%, wherein the silica particles consist only of silica particles (silica particles (B')) having an average primary particle size of more than 30 nm and less than 45 nm as measured by the BET method, it has been confirmed that while maintaining a good polishing rate of 0.25 to 0.29 μm/min, the amount of wear on one side of the carrier can be suppressed to a good value of not greater than 1.9 μm/8 hours, after the polishing was performed for 8 hours.

Therefore, according to the present invention, it has been found that the reduction of wear (i.e., wear prevention) on a carrier can be made possible while maintaining a good polishing rate. As a result, it was found that the present invention is excellent in terms of extending the replacement period of a carrier and accuracy of the polished surface of the obtained wafer.

INDUSTRIAL APPLICABILITY

The present invention provides, in a method for polishing a silicon wafer with a polishing machine using a carrier to hold the silicon wafer, a method of making wear on a carrier reduced, and further making noise generated from the carrier reduced.

According to the present invention, when polishing a silicon wafer with a polishing machine using a carrier to hold the silicon wafer, a polishing method capable of: reducing wear on the carrier while maintaining a good polishing rate; improving polishing accuracy; reducing the frequency of carrier replacement; suppressing variations in polishing rate and polishing quality can be suppressed; and reducing noise (i.e., abnormal noise) generated from carriers can be provided, and thus the present invention has the applicability in various industrial fields (particularly, in fields such as a highly reliable semiconductor device and electronic component device) that are desired to easily and efficiently improve polishing accuracy of a silicon wafer by using a carrier.

The invention claimed is:

1. A method for polishing a silicon wafer with a polishing machine using a carrier to hold the silicon wafer,
    wherein a polishing liquid used in the polishing machine comprises silica particles at a silica concentration of 0.1% by mass to 5% by mass,
    the silica particles consisting of:
        silica particles (A) having an average primary particle size of 4 nm to 30 nm as measured by BET method, and having a ratio (X2/X1) of 1.2 to 1.8 when representing a major-axis average particle size calculated from projection images by transmission electron microscope as (X2) nm and an average primary particle size as measured by the BET method as (X1) nm; and silica particles (B) having an average primary particle size of more than 30 nm and 50 nm or less as measured by the BET method, and having a ratio (X2/X1) of 1.2 to 1.8 when representing a major-axis average particle size calculated from projection images by transmission electron microscope as (X2) nm and an average primary particle size as measured by the BET method as (X1) nm, wherein a mass ratio of the silica particles (A) to the silica particles (B) is 100:0 to 85:15, and wherein an amount of wear on one side of the carrier is within 3 μm when the polishing is continuously performed for 8 hours.

2. The method according to claim 1 using a double-sided polishing machine as the polishing machine, comprising polishing the silicon wafer under conditions of a load of 30 to 1000 g/cm$^2$, a lower surface plate rotation speed of 5 to 100 rpm, an upper surface plate rotation speed of 2 to 30 rpm, a rotation ratio of a lower surface plate/an upper surface plate of 1 to 10, a polishing time of 10 minutes to 3 hours, and a polishing liquid supply amount of 1 to 20 liters/minute.

3. The method according to claim 1, wherein the carrier is an epoxy glass carrier.

4. The method according to claim 1, wherein the polishing liquid further comprises at least one additive agent selected from the group consisting of an alkaline component, a water-soluble compound, and a chelating agent.

5. The method according to claim 4, wherein the alkaline component is sodium hydroxide, potassium hydroxide, ammonia, primary ammonium hydroxide, secondary ammonium hydroxide, tertiary ammonium hydroxide, quaternary ammonium hydroxide, lithium carbonate, sodium carbonate, potassium carbonate, lithium hydrogen carbonate, sodium hydrogen carbonate, potassium hydrogen carbonate, sodium hydroxide, or potassium hydroxide.

6. The method according to claim 4, wherein the chelating agent is an aminocarboxylic acid-based chelating agent or a phosphonic acid-based chelating agent.

7. The method according to claim 1, wherein a pH value of the polishing liquid is 7 to 12.

8. A method for polishing a silicon wafer with a polishing machine using a carrier to hold the silicon wafer, wherein a polishing liquid used in the polishing machine comprises:

silica particles at a silica concentration of 0.1% by mass to 5% by mass, the silica particles consisting of: silica particles (A) having an average primary particle size of 4 nm to 30 nm as measured by BET method; and silica particles (B) having an average primary particle size of more than 30 nm and 50 nm or less as measured by the BET method, wherein a mass ratio of the silica particles (A) to the silica particles (B) is 100:0 to 85:15; or silica particles at a silica concentration of 0.1% by mass or more and less than 2.5% by mass, the silica particles consisting only of silica particles (B') having an average primary particle size of more than 30 nm and less than 45 nm as measured by the BET method, and wherein an amount of wear on one side of the carrier is within 3 μm when the polishing is continuously performed for 8 hours.

9. The method according to claim 8, wherein the silica particles (A), the silica particles (B), and the silica particles (B') have, when representing a major-axis average particle size calculated from projection images by transmission electron microscope as (X2) nm and an average primary particle size as measured by the BET method as (X1) nm, a ratio (X2/X1) of 1.2 to 1.8.

10. The method according to claim 8 using a double-sided polishing machine as the polishing machine, comprising polishing the silicon wafer under conditions of a load of 30 to 1000 g/cm$^2$, a lower surface plate rotation speed of 5 to 100 rpm, an upper surface plate rotation speed of 2 to 30 rpm, a rotation ratio of a lower surface plate/an upper surface plate of 1 to 10, a polishing time of 10 minutes to 3 hours, and a polishing liquid supply amount of 1 to 20 liters/minute.

11. The method according to claim 8, wherein the carrier is an epoxy glass carrier.

12. The method according to claim 8, wherein the polishing liquid further comprises at least one additive agent selected from the group consisting of an alkaline component, a water-soluble compound, and a chelating agent.

13. The method according to claim 8, wherein a pH value of the polishing liquid is 7 to 12.

* * * * *